US008800763B2

(12) United States Patent
Hale

(10) Patent No.: US 8,800,763 B2
(45) Date of Patent: Aug. 12, 2014

(54) DEVICE CASE AND MOUNTING APPARATUS

(75) Inventor: Eric C. Hale, San Francisco, CA (US)

(73) Assignee: Daymen US, Inc., Petaluma, CA (US)

(*) Notice: Subject to any disclaimer, the term of this patent is extended or adjusted under 35 U.S.C. 154(b) by 0 days.

(21) Appl. No.: 13/186,743

(22) Filed: Jul. 20, 2011

(65) Prior Publication Data

US 2012/0018324 A1 Jan. 26, 2012

Related U.S. Application Data

(60) Provisional application No. 61/366,940, filed on Jul. 23, 2010, provisional application No. 61/422,124, filed on Dec. 10, 2010.

(51) Int. Cl.
*B65D 85/00* (2006.01)
(52) U.S. Cl.
USPC .......................................................... 206/320
(58) Field of Classification Search
USPC .......................................................... 206/320
See application file for complete search history.

(56) References Cited

U.S. PATENT DOCUMENTS

| 5,042,713 | A | * | 8/1991 | Stafford ................... 229/117.02 |
|---|---|---|---|---|
| 5,248,373 | A | * | 9/1993 | Minnick et al. ............ 156/306.6 |
| 5,887,723 | A | * | 3/1999 | Myles et al. .................. 206/760 |
| 6,223,896 | B1 | * | 5/2001 | Bell et al. ...................... 206/320 |
| 6,266,241 | B1 | * | 7/2001 | Van Brocklin et al. .. 361/679.46 |
| 6,536,589 | B2 | * | 3/2003 | Chang ........................... 206/320 |
| 6,590,764 | B2 | * | 7/2003 | Silverstein ............... 361/679.56 |
| 6,697,045 | B2 | * | 2/2004 | Min .............................. 345/156 |
| 7,148,874 | B2 | * | 12/2006 | Anzai et al. ................... 345/156 |
| 7,281,698 | B2 | * | 10/2007 | Patterson, Jr. ................ 248/458 |
| 7,542,052 | B2 | * | 6/2009 | Solomon et al. ............. 345/659 |
| 7,561,415 | B2 | * | 7/2009 | Liou et al. ................ 361/679.26 |
| 7,735,644 | B2 | * | 6/2010 | Sirichai et al. ................ 206/320 |
| 2008/0035808 | A1 | * | 2/2008 | Rawlings et al. .......... 248/176.1 |
| 2011/0159261 | A1 | * | 6/2011 | Sugimoto et al. ............. 428/215 |
| 2011/0221319 | A1 | * | 9/2011 | Law et al. ..................... 312/325 |

* cited by examiner

*Primary Examiner* — Anthony Stashick
*Assistant Examiner* — Mollie Llewellyn
(74) *Attorney, Agent, or Firm* — Michael A. Guth

(57) ABSTRACT

A multi-function case and support for an electronic device, such as a tablet computer. The case may be adapted to support the tablet in a variety of configurations, such as similar to a laptop computer configuration, and as a raised support. The case may also protect the electronic device from rough contact and other wear. In the raised support configuration, the case and support may be adapted to allow for rotation of the tablet from a landscape to a portrait attitude.

5 Claims, 16 Drawing Sheets

DEVICE CASE AND MOUNTING APPARATUS

CROSS-REFERENCE TO RELATED APPLICATIONS

This application claims priority to U.S. Provisional Patent Application No. 61/366,940 to Hale, filed Jul. 23, 2010, which is hereby incorporated by reference in its entirety. This application claims priority to U.S. Provisional Patent Application No. 61/422,124 to Hale, filed Dec. 10, 2010, which is hereby incorporated by reference in its entirety.

BACKGROUND

1. Field of the Invention

The present invention relates to a device case and a flexible support apparatus, adapted to support an item mounted in the device case in a variety of configurations.

2. Description of Related Art

Modern portable electronic devices, such as tablet computing devices, are not well adapted to be positioned other than on a flat surface, with the screen facing directly vertically. These items are typically flat, rectangular objects which may be difficult to place in an appropriate position for hands-free use while viewing. They may also be of a somewhat environmentally and impact sensitive nature.

Such devices may be enhanced with the use of a protective case which affords impact protection for the device. The use of a tablet device may be enhanced with the use of a support structure. What is called for is a protective case that may also function as a mounting apparatus. What is also called for is a case for a tablet device which allows the support or mounting of the tablet device in multiple configurations.

SUMMARY

A multi-function case and support for an electronic device, such as a tablet computer. The case may be adapted to support the tablet in a variety of configurations, such as similar to a laptop computer configuration, and as a raised support. The case may also protect the electronic device from rough contact and other wear. In the raised support configuration, the case and support may be adapted to allow for rotation of the tablet from a landscape to a portrait attitude.

DETAILED DESCRIPTION

Figure 1:
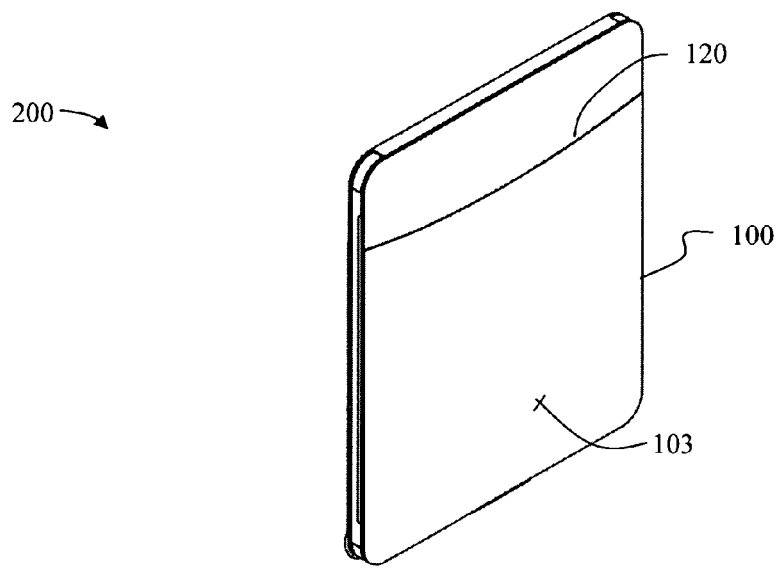
FIG. 1 illustrates a device case and support in a closed configuration according to a first embodiment of the present invention.

FIGS. 1-5 illustrate the stowed configuration 200 of case and support assembly 100 according to a first embodiment of the present invention. In some embodiments, the electronic device is a tablet computing device. The electronic device may also be another device. The electronic device 110 may have a screen 111.

In some embodiments, the case and support assembly 100 is adapted to be a protective cover as well as a support for viewing the electronic device, which may be a tablet, in a variety of positions. When in the stowed configuration 200, the case and support assembly may still allow access to aspects of the device via slots or openings in the rim 105, which may be used to operate the device, or for other reasons.

Figure 2:
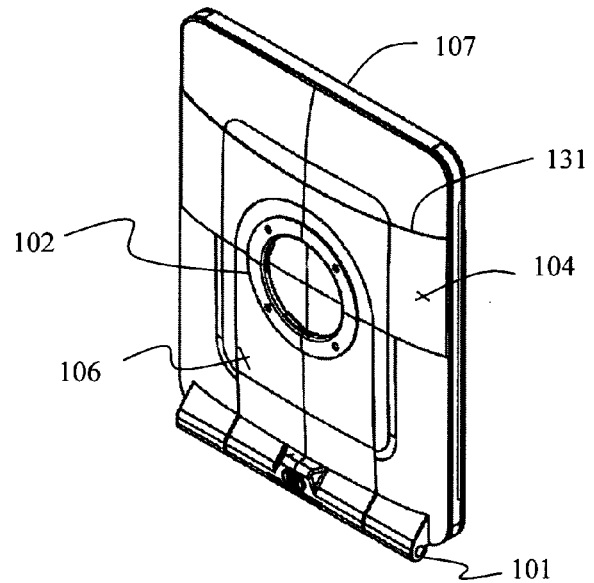
FIG. 2 illustrates a device case and support in a closed configuration according to a first embodiment of the present invention.
Figure 3:
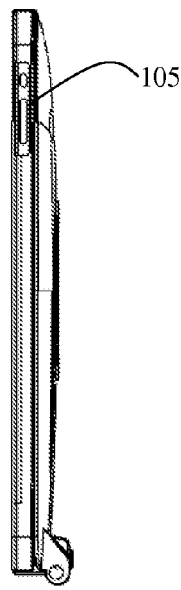
FIG. 3 illustrates a device case and support in a closed configuration according to a first embodiment of the present invention.
Figure 4:
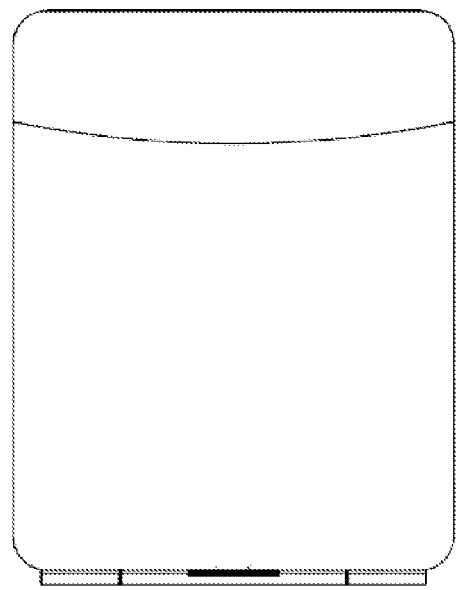
FIG. 4 illustrates a device case and support in a closed configuration according to a first embodiment of the present invention.
Figure 5:
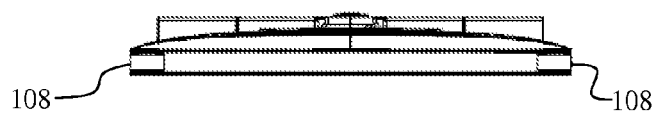
FIG. 5 illustrates a device case and support in a closed configuration according to a first embodiment of the present invention.
Figure 6:
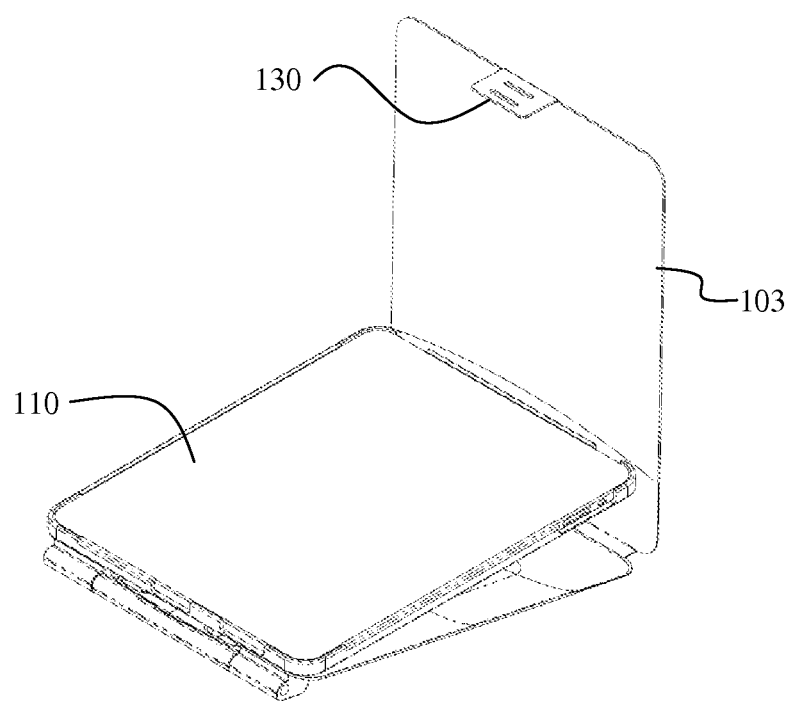
FIG. 6 illustrates a device case and support in a partially open configuration according to a first embodiment of the present invention.
Figure 7:
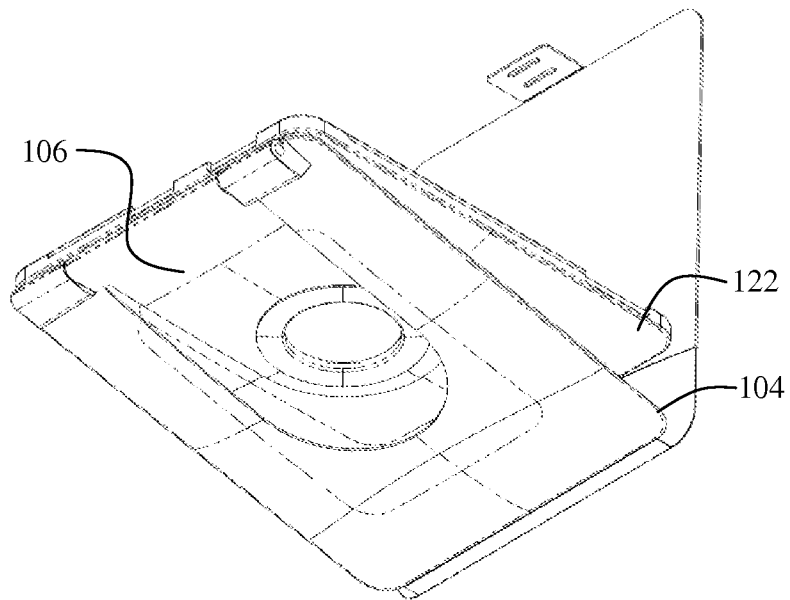
FIG. 7 illustrates a device case and support in a partially open configuration according to a first embodiment of the present invention.
Figure 8:
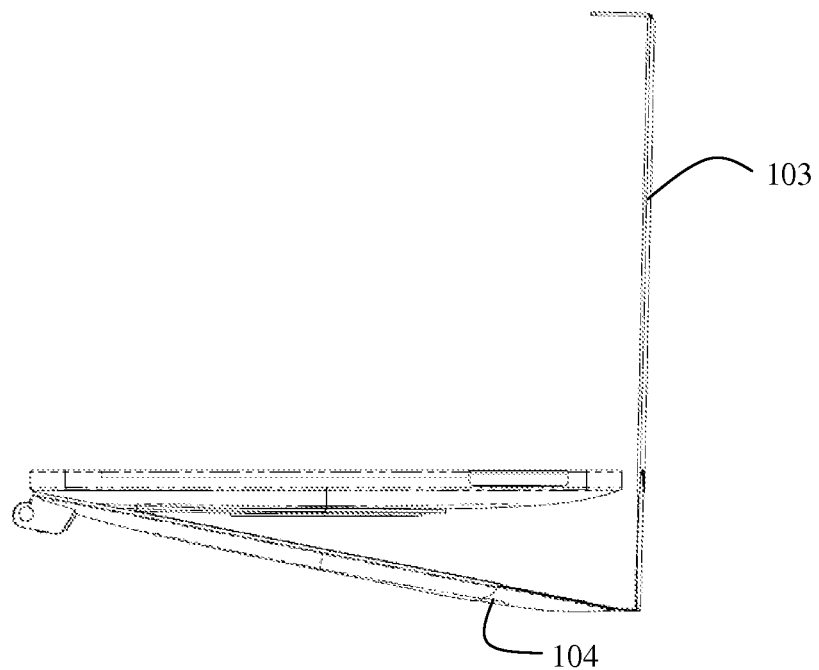
FIG. 8 illustrates a device case and support in a partially open configuration according to a first embodiment of the present invention.
Figure 9:
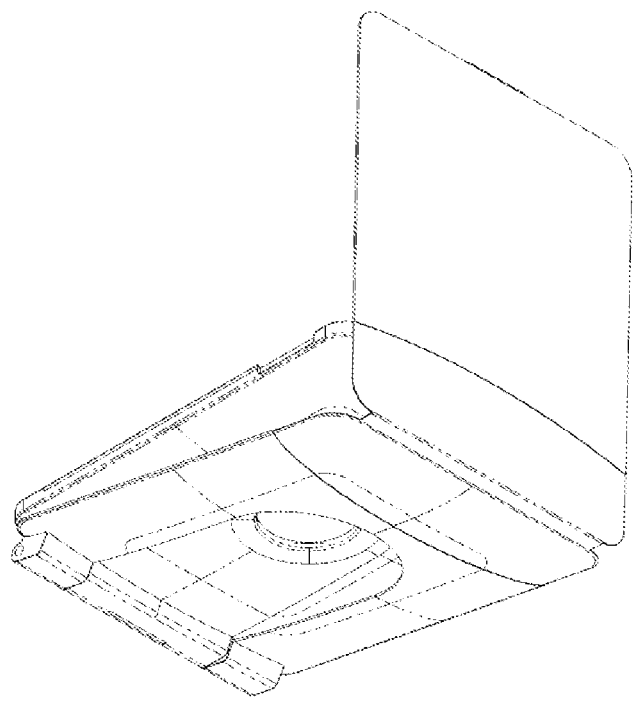
FIG. 9 illustrates a device case and support in a partially open configuration according to a first embodiment of the present invention.
Figure 10:
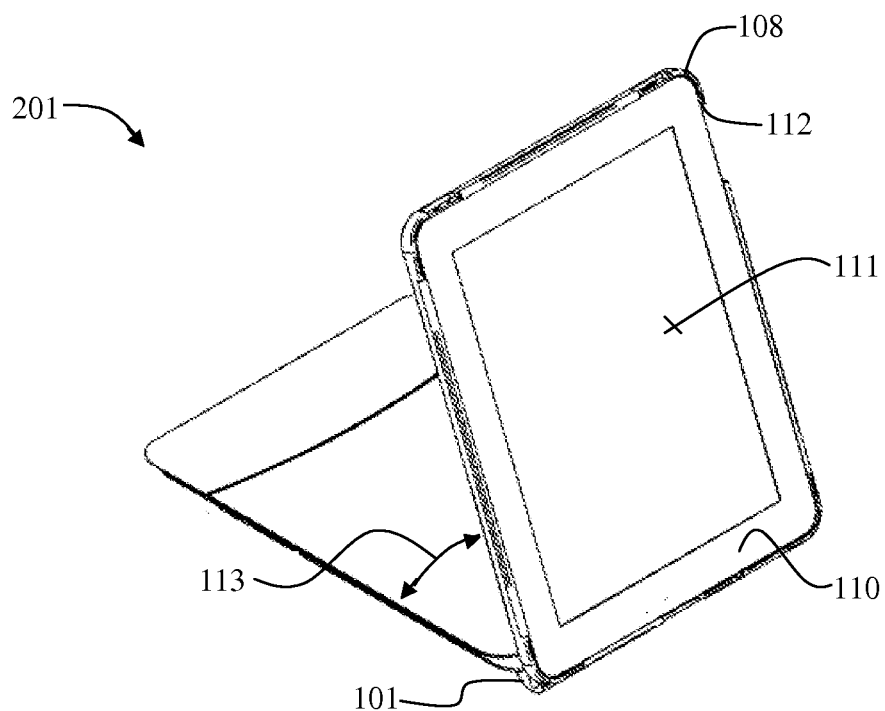
FIG. 10 illustrates a device case and support in a first deployed configuration according to a first embodiment of the present invention.
Figure 11:
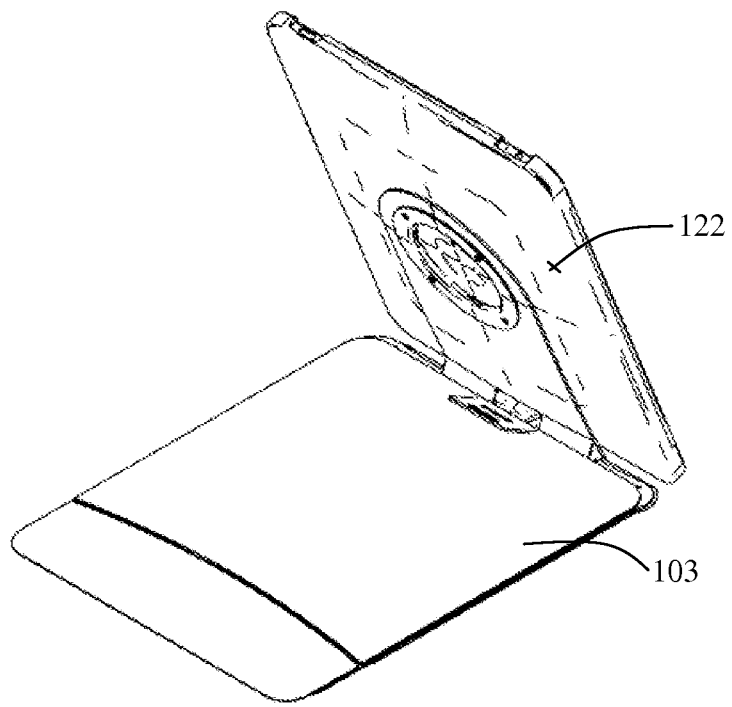
FIG. 11 illustrates a device case and support in a first deployed configuration according to a first embodiment of the present invention.
Figure 12:
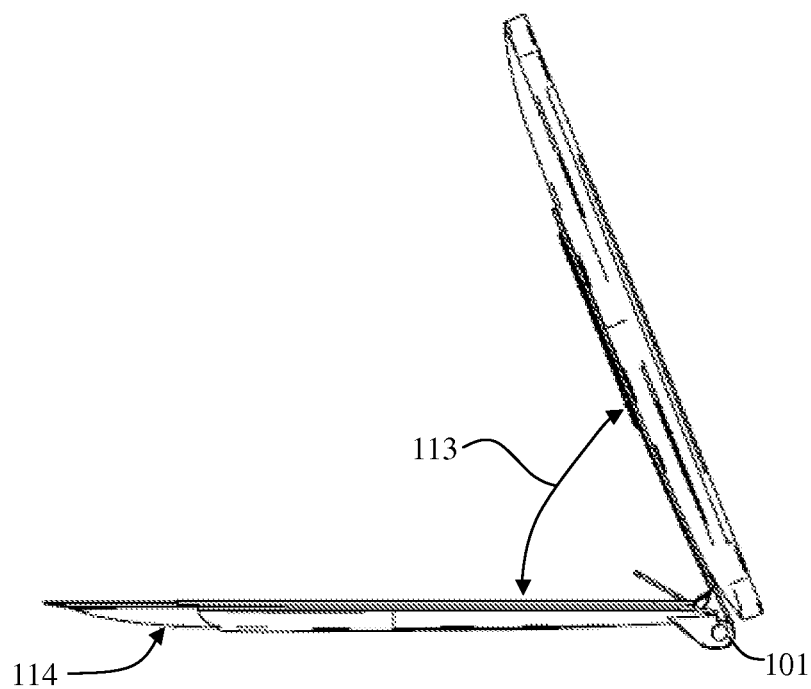
FIG. 12 illustrates a device case and support in a first deployed configuration according to a first embodiment of the present invention.
Figure 13:
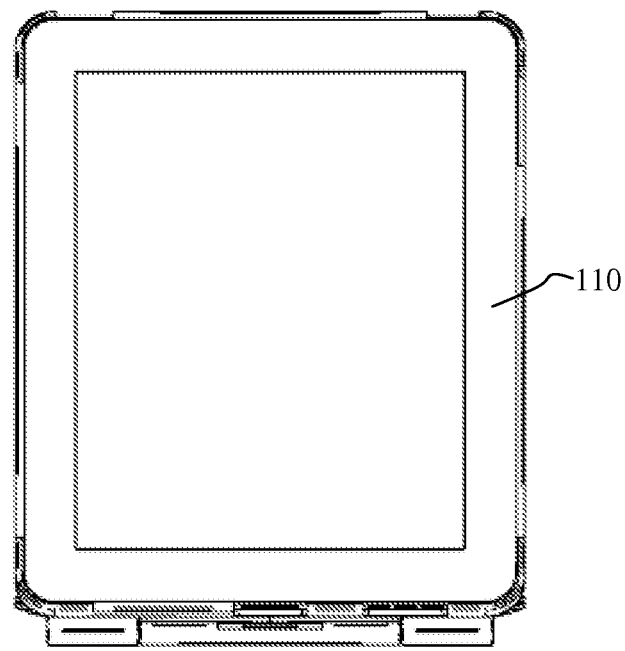
FIG. 13 illustrates a device case and support in a first deployed configuration according to a first embodiment of the present invention.

As seen in FIG. 2, a rear section 104 covers over portions of the rear of the case and support assembly 100. The rear section 104 may be adapted to fit around a rear support 106, which is the bridge between the main hinge 101 and the rotary joint 102. The rear section 104 is connected on a first end to the main hinge 101. The main hinge 101 thus provides rotation between the rear support 106 and the rear section 104. The main hinge may be adapted to have an adjustment such that the friction in the main hinge is sufficient to hold the case and support assembly in positions set by the user.

A flexible intermediate section 107 is adapted to provide an intermediate section between the front cover section 103 and the rear section 104. In some embodiments, the front cover section 103 and the rear section 104 may be a somewhat more rigid material, while the intermediate section 107 may be more flexible, to allow for bending into a variety of positions in order to support different case configurations. The flexible intermediate portion 107 may extend from a position 131 on the rear section to a position 120 on the front cover section 103, allowing for a much larger flexible portion than just at the bend area in this stowed position 200.

In the stowed configuration, a tablet may be in the device receiver portion, and the rear section 104 may be snug against the rear of the device receiver, with the front cover closed snugly over the front of the tablet. A latch 130 is adapted to fasten the case and support assembly in the stowed configuration.

FIGS. 6-9 illustrate the case and support assembly in a partially opened configuration, as it may be when transitioning from a stowed configuration to one of the deployed configurations. The front cover section 103 is seen unlatched and lifted off of the tablet 110 which resided within the case and support assembly in the stowed position. As the case and support assembly is opened, the rear section 104 may be pulled from the back of the device receiver 122. The rear support 106 may be adapted to fit within a cutout in the rear section 104. As the case and support assembly is opened, the front of the tablet 110 becomes accessible and may be operated by the user.

FIGS. 10-13 illustrate the case and support assembly 100 in a first deployed configuration 201. The tablet 110 with its screen 111 is mounted within the device receiver 122. A rim, or series of rim portions 108 of the device receiver may have a lip 112 which helps hold the tablet 110 in place.

The rear surface 114 of the rear section 104 may be placed on a table or desk or other suitable surface, including the lap of the user. The front cover 103 have been removed from the front of the tablet 110 and folded over onto the inside of the rear section 104. The flexible intermediate section 107 has been folded such that the front cover 103 may be placed over the rear section 104. The main hinge 101 has been placed into a position such that the angle 113 between the tablet 110 and the base provides a desired angle for the user.

The rotary hinge 102 between the rear support 106 and the device receiver 122 allows the tablet to be rotated, as from a portrait position to a landscape position.

Figure 14:
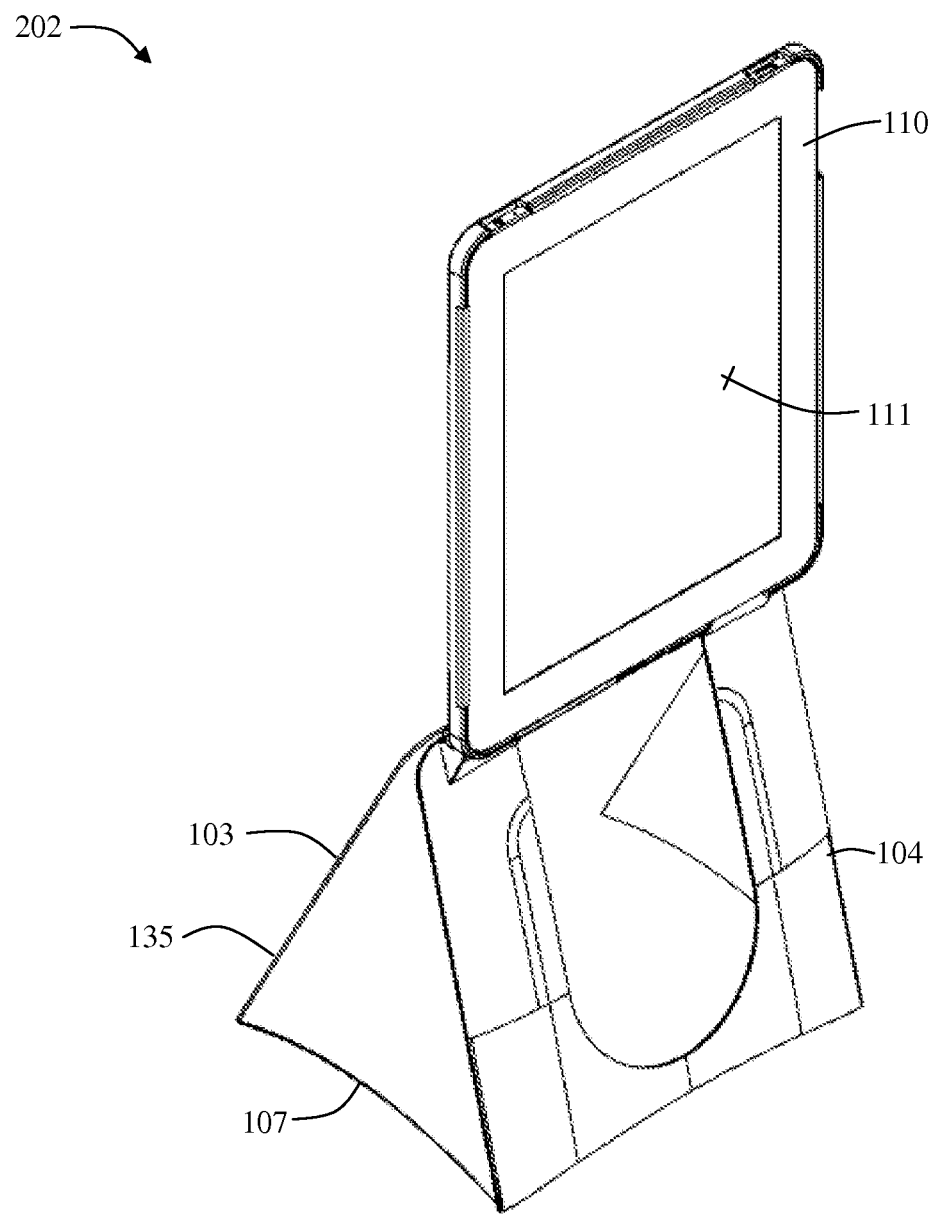
FIG. 14 illustrates a device case and support in a second deployed configuration according to a first embodiment of the present invention.
Figure 15:
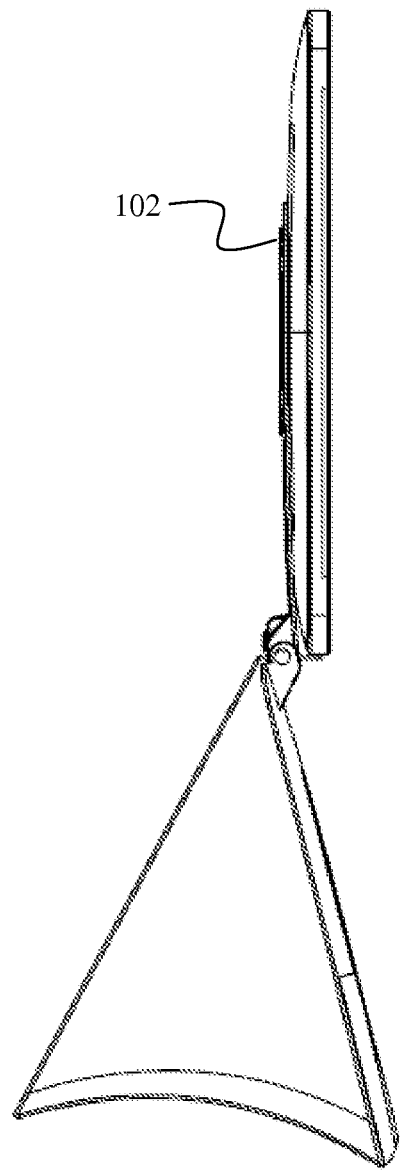
FIG. 15 illustrates a device case and support in a second deployed configuration according to a first embodiment of the present invention.
Figure 16:
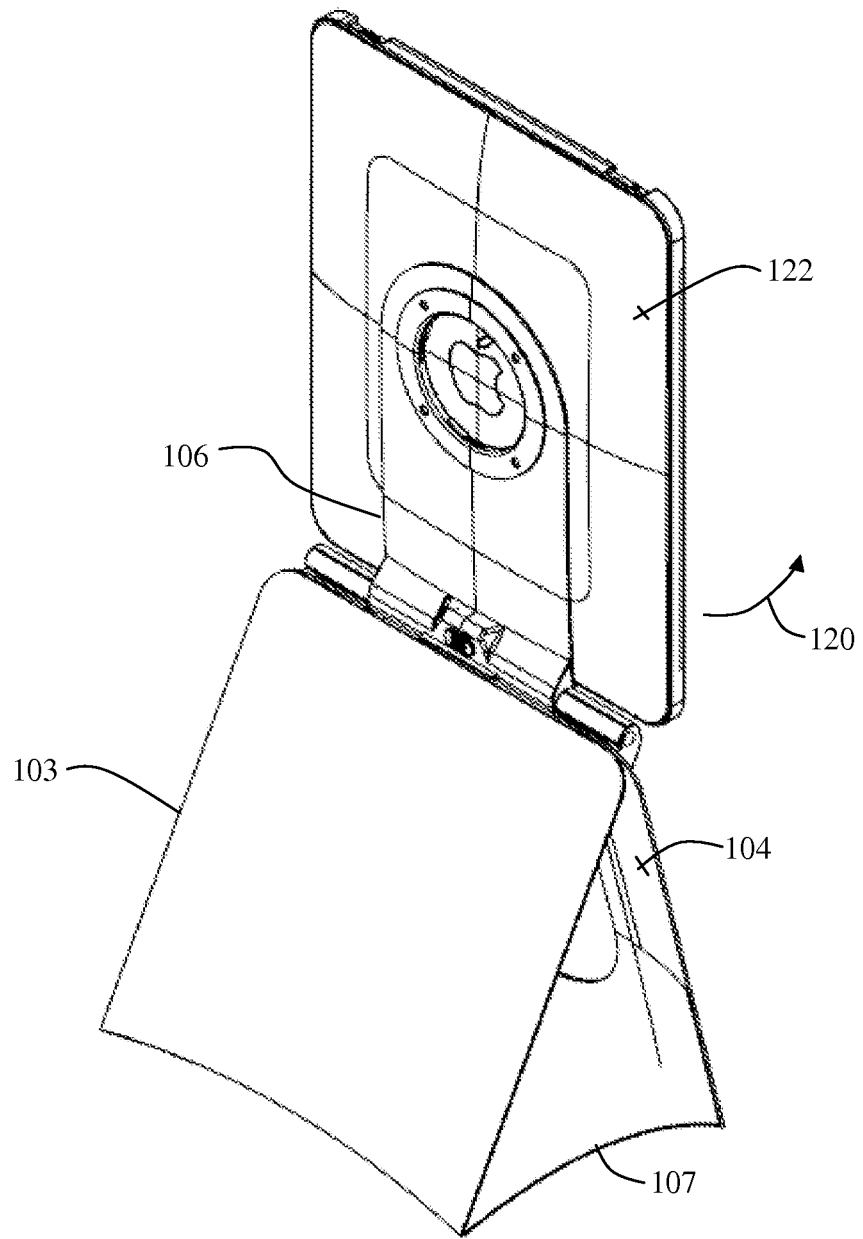
FIG. 16 illustrates a device case and support in a second deployed configuration according to a first embodiment of the present invention.

FIGS. 14-16 illustrate a second deployed configuration 202 according to some embodiments of the present invention. As seen, the rear section 104 and the front cover section 103 have been formed along with the flexible intermediate section 107 to create a base 135 for the tablet 110 within the device receiver 122. In this second deployed configuration, the flexible intermediate portion 107 has been folded at the position 131 on the rear section and the position 120 on the front cover section 103, which represent the transition from the relatively rigid to the relatively flexible portions of the rear section and the front cover section, respectively.

Figure 17:
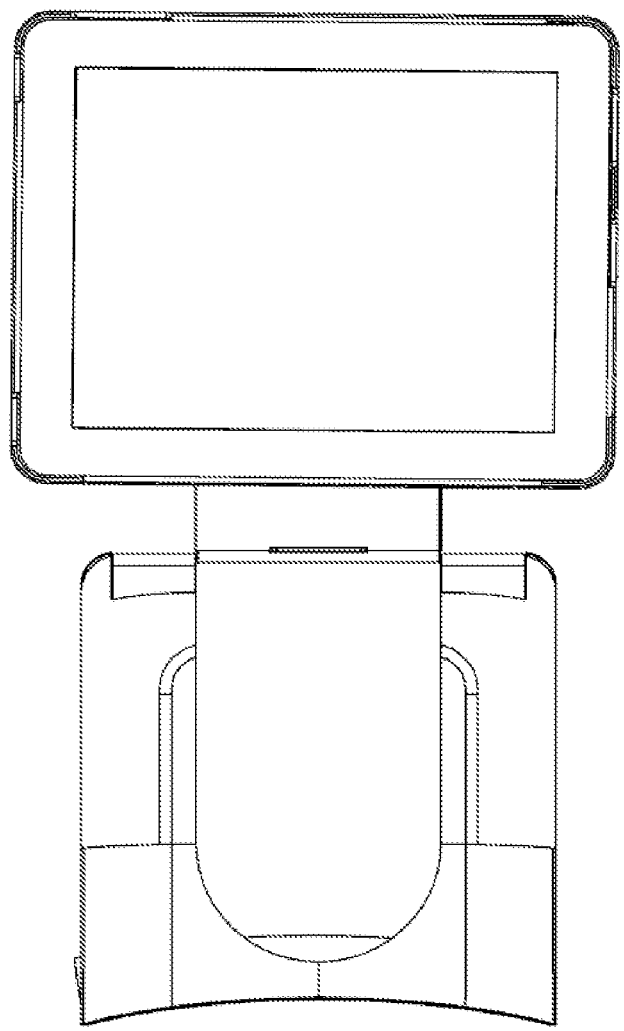
FIG. 17 illustrates a device case and support in a third deployed configuration according to a first embodiment of the present invention.
Figure 18:
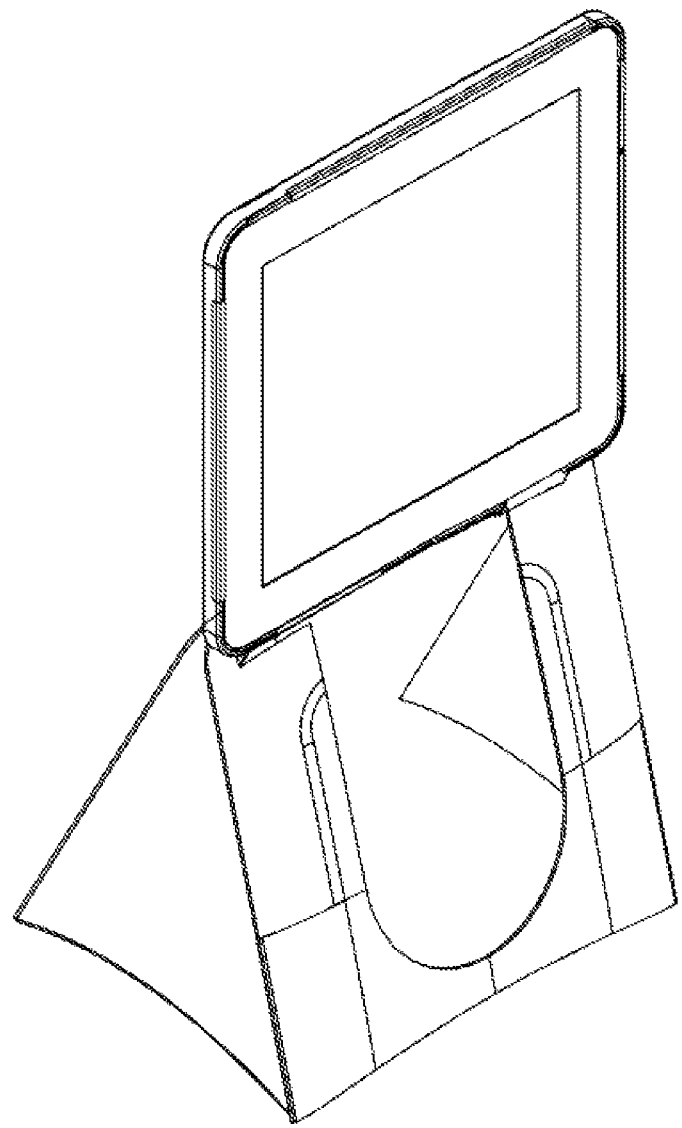
FIG. 18 illustrates a device case and support in a third deployed configuration according to a first embodiment of the present invention.

As seen in FIG. 17, the device receiver 122 and tablet 110 may be rotated to accommodate the needs of the user.

In some embodiments, the case and support assembly 100 may be predominantly of a composite aluminum material with a polypropylene core and aluminum skins. Using this material, the rear section, flexible intermediate section, and the front cover section may be constructed of a single piece of such a material. For the flexible intermediate section, the aluminum skins may be removed, such as with machining, and thus provide the different stiffness properties of the different sections.

Figure 19:
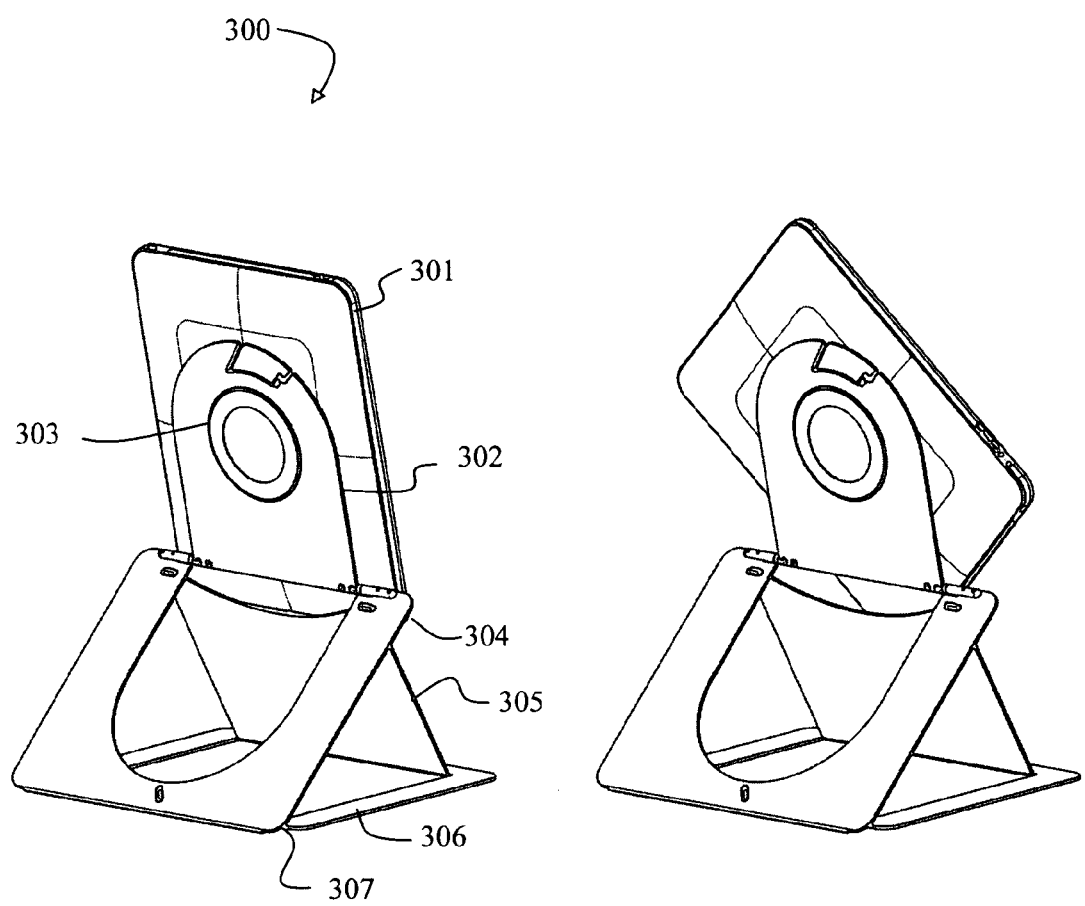
FIG. 19 illustrates a device case according to a second embodiment of the present invention.

In a second embodiment of the present invention, as seen in FIG. 19, a case and support assembly may use another configuration. In this embodiment, a portion of one layer of the device case folds away from the panel in which it sometimes resides in order to form a support. The fold away portion may be inserted into slots on the adjoining panel to form a stable base as shown.

In some embodiments, a front section may have an outer front section 306 and an inner front section 305. The outer front section 306 and inner front section 305 may form a single front section which acts as a front cover for an electronic device when the case and support assembly are in a stowed configuration. When in an open configuration, the inner front section may snap out of the outer front section allowing the inner front section to interlock with the outer rear section 304, forming a base of a support structure. As illustrated in FIG. 19 in a deployed configuration, the case is used as a support structure which may hold the tablet device above a surface. Also, the tablet may be rotated from a portrait to a landscape use.

Figure 20:
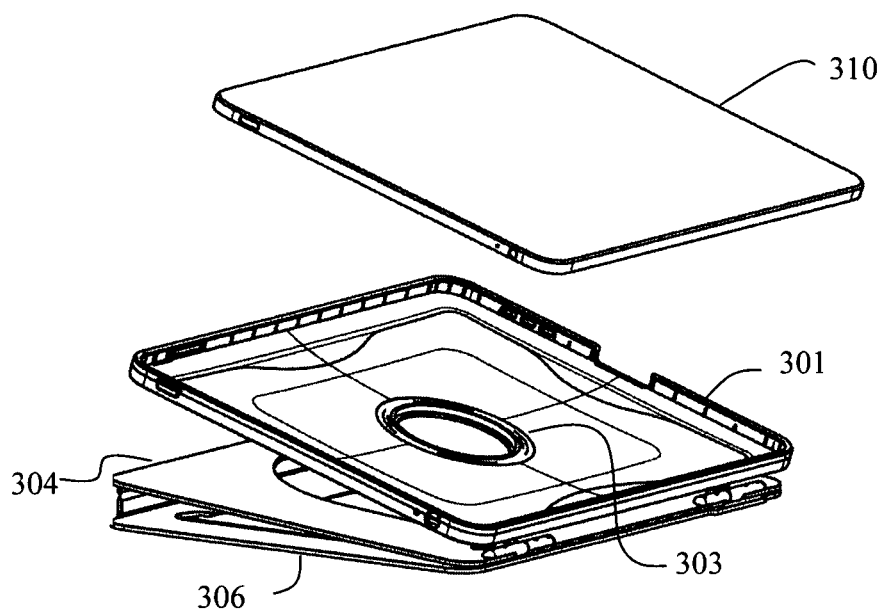
FIG. 20 illustrates a device case according to a second embodiment of the present invention.
Figure 21:
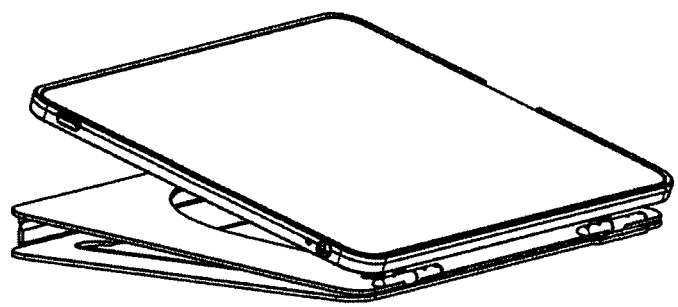
FIG. 21 illustrates a device case according to a second embodiment of the present invention.

FIGS. 20 and 21 illustrate a configuration wherein the panels are folded upon each other, with the device receiver able to be set at an angle using the hinge as seen. The case and support system 300 allows for a relatively simple protective case to be used as a relatively complex support system, with a variety of support configurations. In addition to the deployed configuration of FIG. 19, with its options of landscape or portrait viewing, another support configuration is seen in FIGS. 20 and 21, allowing for support of the tablet closer to the supporting surface. In the use configuration of FIG. 21, the tablet 310 resides in the device receiver 301. The device receiver may have a rim around some or all sides adapted to receive and clamp or snap around the tablet with the use of a lip, for example. The rotary joint 303 attaches the inner rear section to the device receiver, and the inner rear section may be hinged somewhat from the outer rear section to allow for a slight raising while viewing the tablet. The front section has been pulled away from the front of the tablet and is folded under by the bending of the second hinge 307.

Figure 22:
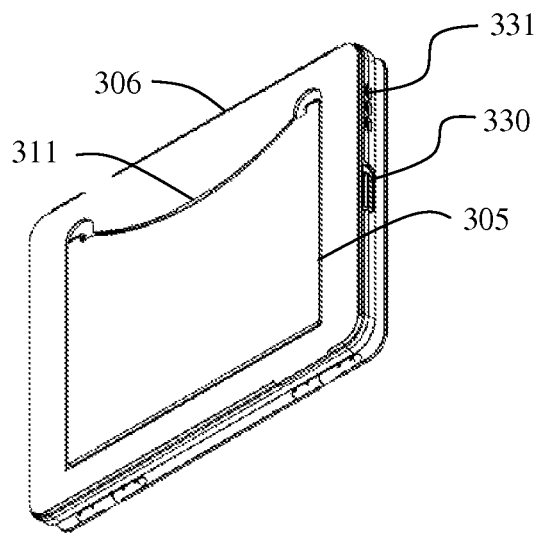
FIG. 22 illustrates a device case according to a second embodiment of the present invention.

FIG. 22 illustrates the case in a closed configuration with a tablet inside. The front section has its front inner section 305 and its front outer section 306 attached together with a snap 311 adapted to keep the front inner section 305 and its front outer section 306 together and coplanar while closed. The closed case is an excellent protective case for the tablet, or for other items. In some embodiments, the case is made using a multi-layer material such as a polypropylene core with aluminum skins. The metal skins provide excellent protection when used as a cover in addition to providing strength and stiffness for the support when used as a support. Although not shown in FIG. 22 for clarity, a screen cover may be mounted within the front outer section 306 and be of a soft material appropriate for covering the device screen while the case is closed. The screen cover may be sized such that it is adapted to cover the entire screen of the device. In some embodiments, there may be magnets embedded within or under the screen cover adapted to interface with magnetic switching of the device held by the device receiver. Also, as the rotary joint 303 may allow for the device to be stowed in two positions (180 degrees apart), the magnets may be placed in two places in the screen cover to allow functionality, such as turning the device on or off, in either of the rotated positions.

Figure 23:
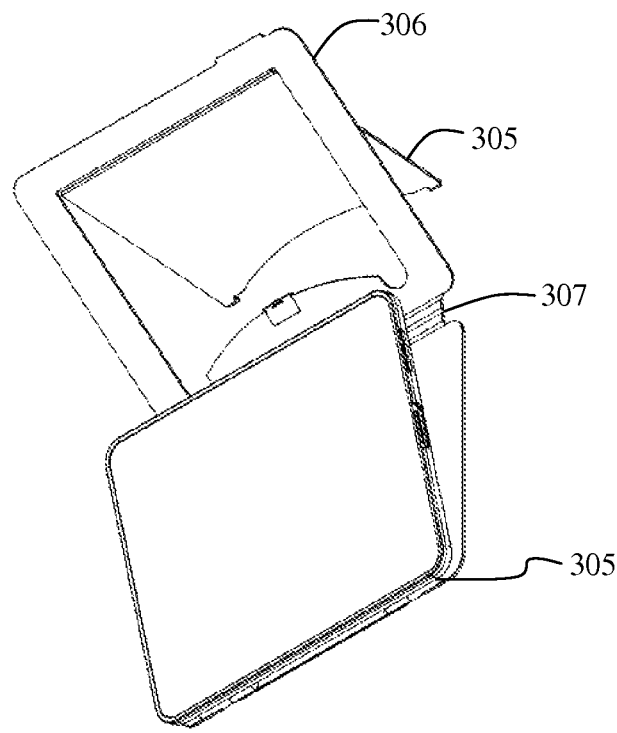
FIG. 23 illustrates a device case according to a second embodiment of the present invention.
Figure 24:
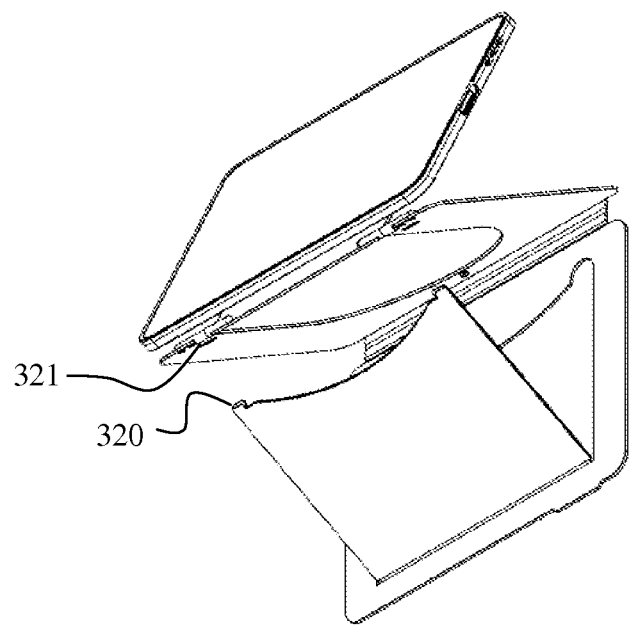
FIG. 24 illustrates a device case according to a second embodiment of the present invention.
Figure 25:
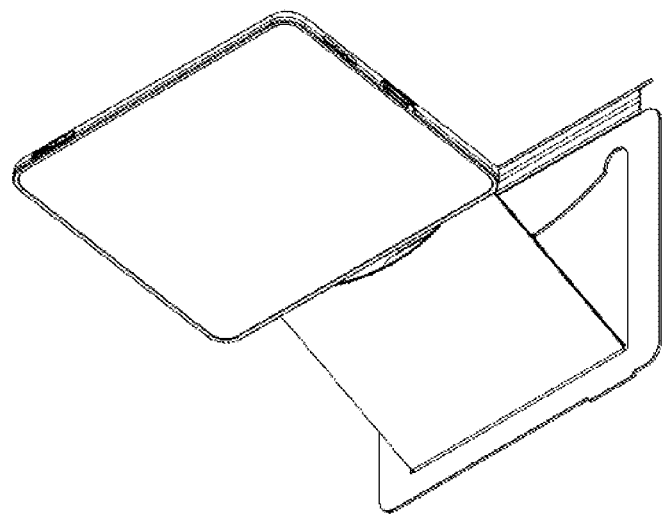
FIG. 25 illustrates a device case according to a second embodiment of the present invention.

FIGS. 22-25 illustrate an unfolding sequence which may be used to arrive at the configurations seen in FIG. 19. FIGS. 23-25 illustrate the deployment of the case as it is put into the upright deployed configuration. The front section, consisting of the front inner section 305 and the front outer section 306, is folded away from the top of the tablet device. The hinge 307 may be the polypropylene core of the composite material which may be used as the primary case material in some embodiments. In the area of this hinge, the metal skins of the composite material may be removed. As seen in FIG. 23, the inner front section 305 may be snapped away from the outer front section 306 and folded out. This hinge area may also be an area where the skins of the composite sandwich material may have been removed. The tablet in the device receiver, and the inner rear section, are shown somewhat deployed from the outer rear section. The first hinge 305 may be a frictional hinge adapted to support the weight of the tablet in a desired position without slipping. In some embodiments, there may be access ports 330, 331 in the case located appropriately to allow access to functionalities of the device supported by the case.

As seen in FIGS. 24 and 25, the inner front portion may be used to form a support between the outer front portion, which may be used as a support base, and the outer rear portion. Tabs 320 on the inner rear front portion may engage slots 321 on the on the outer rear portion to form a coherent support for the tablet. The first hinge may be a frictional hinge adapted to hold the tablet, housed in the device receiver, in a fixed position set by the user.

Figure 26:
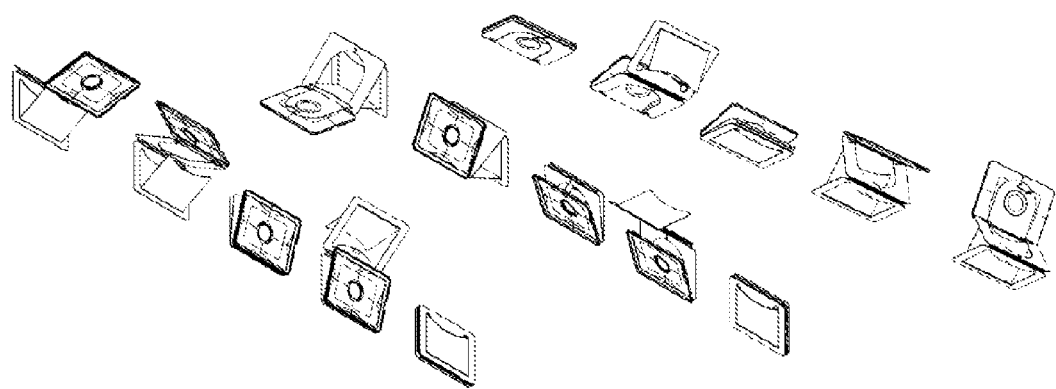
FIG. 26 illustrates a multitude of views of a device case according to a second embodiment of the present invention.
Figure 27:
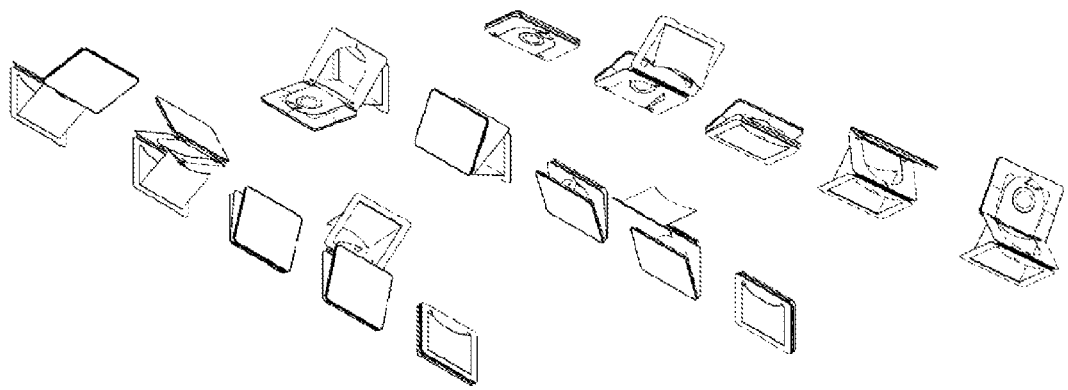
FIG. 27 illustrates a multitude of views of a device case according to a second embodiment of the present invention.

FIGS. 26 and 27 illustrate a plurality of views of this embodiment.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

I claim:

1. A multi-configuration case and support assembly adapted to support a tablet computer, said assembly comprising:
    a front cover, said front cover adapted to cover the front of a device while in a closed configuration;
    a back cover; wherein said back cover is adapted to cover the back of a device while in the closed configuration, said back cover comprising:
        an inner back cover portion; and
        an outer back cover portion, wherein said inner back cover portion and said outer back cover portion fit together in a single plane when in the closed configuration, said inner back cover portion coupled to said outer back cover portion with a frictional hinge, said inner back cover portion adapted to hinge away from said outer back cover portion thereby leaving a through hole space in said back cover;
    a first flexible hinge between said front cover and said back cover;
    a device receiver, and
    a rotary hinge, said rotary hinge coupling said device receiver to said inner back cover portion.

2. The multi-configuration case and support assembly of claim 1 wherein said front cover comprises:
    an inner front cover portion; and
    an outer front cover portion, wherein said inner front cover portion and said outer front cover portion fit together in a single plane when in a closed configuration; and
    a second flexible hinge between said inner front cover portion and said outer front cover portion and wherein said inner front cover portion is adapted to fold away from said outer front cover portion at said second flexible hinge and lock into said outer back cover portion in a deployed configuration.

3. The multi-configuration case and support assembly of claim 2 wherein said outer back cover portion and said front cover are constructed from a single sheet of a composite sandwich material, said composite sandwich material comprising metal skins over a polypropylene core, and wherein said metal skins are removed from said polypropylene core in the areas of said first flexible hinge and said second flexible hinge.

4. A multi-configuration case and support assembly adapted to support a tablet computer, said assembly comprising:
    a front cover, said front cover adapted to cover the front of a device while in a closed configuration, wherein said front cover comprising:
        an inner front cover portion; and
        an outer front cover portion, wherein said inner front cover portion and said outer front cover portion fit together in a single plane when in the closed configuration;
    a back cover; wherein said back cover is adapted to cover the back of a device while in the closed configuration, said back cover comprising:
        an inner back cover portion; and
        an outer back cover portion, wherein said inner back cover portion and said outer back cover portion fit together in a single plane when in the closed configuration, said inner back cover portion coupled to said outer back cover portion with a frictional hinge,
    a first flexible hinge between said front cover and said back cover;
    a second flexible hinge between said inner front cover portion and said outer front cover portion, wherein said inner front cover portion is adapted to fold away from said outer front cover portion at said second flexible hinge and lock into said outer back cover portion in a deployed configuration;
    a device receiver, and
    a rotary hinge, said rotary hinge coupling said device receiver to said inner back cover portion.

5. The multi-configuration case and support assembly of claim 4 wherein said back cover and said front cover are constructed from a single sheet of a composite sandwich material, said composite sandwich material comprising metal skins over a polypropylene core, and wherein said metal skins are removed from said polypropylene core in the areas of said first flexible hinge and said second flexible hinge.

* * * * *